United States Patent [19]

Takahashi et al.

[11] Patent Number: 4,928,248

[45] Date of Patent: May 22, 1990

[54] LIGHT SOURCE DRIVING DEVICE

[75] Inventors: Akira Takahashi; Musubu Koishi, both of Shizuoka, Japan

[73] Assignee: Hamamatsu Photonics Kabushiki Kaisha, Shizuoka, Japan

[21] Appl. No.: 347,375

[22] Filed: May 3, 1989

[30] Foreign Application Priority Data

May 7, 1988 [JP] Japan .................................. 63-110750

[51] Int. Cl.$^5$ ............................................. H01S 3/097
[52] U.S. Cl. ........................................ 372/38; 372/33; 372/81; 372/82
[58] Field of Search ....................... 372/38, 81, 82, 35

[56] References Cited

U.S. PATENT DOCUMENTS 4,635,267  1/1987  Cirkel .................................... 372/38

FOREIGN PATENT DOCUMENTS

| 0005595 | 11/1979 | European Pat. Off. | 372/38 |
| 0235813 | 9/1987 | European Pat. Off. | 372/38 |
| 0191482 | 11/1983 | Japan | 372/38 |
| 0296572 | 12/1987 | Japan | 372/38 |

OTHER PUBLICATIONS van der Ziel, J. P. et al., "Generation of Short Optical Pulses in Semiconductor Lasers by Combined dc and Microwave Current Injection", IEEE Journal of Quantum Electronics, vol. QE-18, No. 9, pp. 1340-1350, Sep. 1989.

Lin, C. et al., "Simple Picosecond Pulse Generation Scheme for Injection Lasers", Electronics Letters, vol. 16, No. 15, pp. 600-602, Jul. 17, 1989.

Parker, D. G., et al., "A Low Cost System for Producing Short Optical Pulses", GEC Journal of Research, vol. 4, No. 1, pp. 28-31, (1986).

Hewlett Packard Application Note 918.

Primary Examiner—William L. Sikes
Assistant Examiner—Georgia Y. Epps
Attorney, Agent, or Firm—Finnegan, Henderson, Farabow, Garrett and Dunner

[57] ABSTRACT

A light source driving device for driving a light source such as a semiconductor laser comprises an input voltage generating section for superposing a pulse voltage on a predetermined DC voltage to provide an input voltage, a voltage converting section having an inductor and a step recovery diode, and a driving section having a delay element. The voltage converting section applies the input voltage through the inductor to the step recovery diode to provide a very short pulse voltage. The driving section applies the very short pulse voltage to the light source, and the delay element delays the very short pulse voltage, inverts the polarity thereof, and applies the inverted very short light pulse to the light source.

6 Claims, 5 Drawing Sheets

FIG. 9(a) INPUT VOLTAGE $V_c$

FIG. 9(b) APPLIED VOLTAGE $V_g$  "0"V $\Delta V_g$

LIGHT SOURCE DRIVING DEVICE

FIELD OF THE INVENTION

This invention relates to a light source driving device for generating single very short light pulses and very short light pulses having repetitive frequencies up to several tens of mega-Hertz (MHz).

BACKGROUND OF THE INVENTION

In order to cause a light source such as a semiconductor laser to generate very short light pulses, a light source driving device has been proposed in the art in which a comb generator, or avalanche element, or two step recovery diodes are used to drive a light source with a short voltage pulse.

The light source driving device with the comb generator, as shown in FIG. 7, comprises a resonance circuit 50 and a step recovery diode 51 so that, with respect to a sine wave input voltage $V_a$, a very short pulse voltage $V_b$ having a pulse width of the order of 100 to 200 pico-seconds is outputted to drive the light source. The light source driving device using the avalanche element outputs a short pulse voltage on its switching characteristic, quick avalanche breakdown, to drive the light source.

A light source driving device having two step recovery diodes is as shown in FIG. 8. That is, the device comprises two step recovery diodes 52 and 53. The rise time and fall time of a pulse like input voltage $V_c$ is reduced, or the bias current of the step recovery diode 53 is increased by means of a constant current source 55, to produce a very short pulse voltage $V_d$ of the order of several hundreds of pico-seconds to drive the light source.

The light source driving device with the comb generator employs the resonance circuit 50, as was described above. Therefore, in the device it is necessary to match the frequency of the input voltage $V_a$ with the resonance frequency of the resonance circuit 50. For instance, when the resonance frequency is 50 MHz, it is impossible to set the very short pulse voltage $V_b$ to other than 50 MHz. The light source driving device using the avalanche element operates on avalanche breakdown, and therefore the repetitive frequency of the short pulse voltage is of the order the maximum of which is 100 KHz because of factors such as avalanche recovery time and so on.

In the light source driving device having two step recovery diodes 52 and 53 as shown in FIG. 8, the input voltage $V_c$ is applied through a capacitor 56 to the step recovery diode 52, and therefore the waveform of a voltage $V_g$ applied to the step recovery diode 52 changes with the frequency of the input voltage $V_c$. In other words, with respect to the input voltage $V_c$ as shown in part (a) of FIG. 9, the voltage $V_g$ across the diode 52 is raised from ground, zero volts, to as much as $\Delta V_g$, which corresponds to the increment in frequency of the input voltage $V_c$ as shown in part (b) of FIG. 9. Therefore, it is not possible to change the frequency of the input voltage $V_c$ to provide a very short pulse voltage $V_d$ having a given repetitive frequency.

In the light source driving device shown in FIG. 8, the very short pulse voltage $V_d$ is about half ($\frac{1}{2}$) of the input voltage $V_c$. Therefore, in order to output a very short pulse voltage $V_d$ high in magnitude it is necessary to receive a high input voltage. Furthermore, the use of two constant current sources 54 and 55 makes the circuit complex.

The conventional light source driving device thus constructed cannot output a very short pulse voltage having a given repetitive frequency in a wide range of frequencies without having a changing waveform. Accordingly, it is impossible to provide single very short light pulses or very short light pulses of repetitive frequencies up to several tens of mega-Hertz (MHz) with their waveforms unaffected by the change in frequency.

OBJECTS AND SUMMARY OF THE INVENTION

An object of the present invention is a light source driving device that can produce a very short light pulse.

Another object of the present invention is a light source driving device that can produce very short, stable light pulses having a given repetitive frequency in a wide range of frequencies.

Still another object of the present invention is a light source driving device that produces very short light pulses over a wide range of frequencies with no change in the waveform of the pulses.

These and other objects of the present invention are achieved by a light source driving device comprising an input voltage generating section for superposing a pulse voltage on a predetermined DC voltage to provide an input voltage, a voltage converting section having inductor means and a step recovery diode, and a driving section having delay means, the voltage converting section applying an input voltage through the inductor means to the step recovery diode to produce a very short pulse voltage and to apply the very short pulse voltage directly to a light source, the very short pulse voltage also being applied to the light source with the polarity thereof inverted.

BRIEF DESCRIPTION OF THE DRAWINGS

The manner by which the above objects, and other objects, features, and advantages of the present invention are attained will be fully apparent from the following detailed description when considered in view of the drawings, wherein:

FIG. 9(a) is a time chart showing an input voltage $V_c$ applied to the light source driving device shown in FIG. 8 and FIG. 9(b) is a time chart showing a voltage $V_g$ applied to the step recovery diode when the input voltage $V_c$ shown in FIG. 9(a) is applied to the device.

DETAILED DESCRIPTION

In the light source driving device according to the present invention, the input voltage obtained by superposing a pulse voltage on a predetermined DC voltage is applied to a voltage converting section, which applies the input voltage through the inductor means to the step recovery diode. In the inductor means, the applied voltage and current are shifted in phase from each other according to the inductance. When no pulse voltage is applied to the step recovery diode, a current based on the input DC voltage flows in the step recovery diode. When a predetermined delay time has passed after the application of the pulse voltage, because of the pulse voltage thus applied, a reverse current flows in the step recovery diode, so that the latter is rendered conductive. After the conduction period, the step recovery diode operates as a high-speed switch to interrupt the reverse current abruptly. As a result, a potential difference due to the transient response is developed across the inductor means. The delay time is determined such that at this time instant the input voltage is forward with respect to the step recovery diode, and the above-described potential difference is eliminated immediately.

The voltage converting section converts the change in potential difference at that time instant into a very short pulse voltage. Immediately after the very short pulse voltage is outputted, the DC voltage is applied to the step recovery diode. Therefore, in the case where the frequency of the output voltage is changed in a wide range of frequencies, and a very short pulse voltage having a frequency in that wide range of frequency is outputted, the waveform of the very short pulse voltage is not affected by the change in frequency. When the very short pulse voltage is applied to the driving section, the latter applies the very short pulse voltage directly to the light source so that a very short light pulse is produced. The very short pulse voltage is further applied to the delay means so that it is applied to the light source with its polarity inverted, whereby the relaxation oscillation is prevented. Thus, a very short light pulse having a frequency corresponding to the frequency of the input voltage can be stably produced with the waveform unaffected by the change in frequency.

Figure 1:
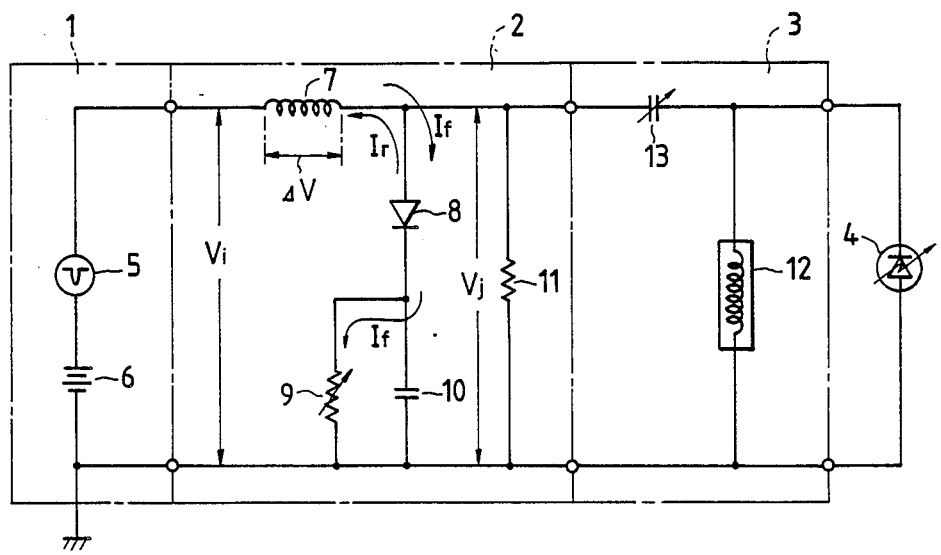
FIG. 1 is a circuit diagram showing an example of a light source driving device according to the present invention.

FIG. 1 is a circuit diagram showing the arrangement of one example of a light source driving device according to the invention. The device, as shown in FIG. 1, comprises an input voltage generating section 1 for generating an input voltage, a voltage converting section 2 for converting the input voltage into a very short pulse voltage, and a driving section 3 for driving a light source, namely, a semiconductor laser 4 with the very short pulse voltage.

The input voltage generating section 1 includes pulse voltage generating means 5 for generating a pulse voltage, and DC voltage generating means 6 for generating a DC voltage. The DC voltage is modulated with the pulse voltage and is applied to the voltage converting section 2.

The voltage converting section 2 is made up of inductor means such as an inductor 7, a step recovery diode 8, a variable resistor 9, a capacitor 10, and a resistor 11. In the voltage converting section 2, the input voltage provided by the input voltage generating means is applied through the inductor 7 to the step recovery diode 8 so that it is converted into a very short pulse voltage of the order of several hundreds of pico-seconds which is applied to the driving section 3.

The driving section 3 comprises a variable capacitor 13 and delay means, for example, a delay line 12. In the driving section 3, the very short pulse voltage outputted by the voltage converting section 2 is applied to the semiconductor laser 4, and it is further applied to the delay line 12 so that an inverted pulse is delayed a predetermined period of time and applied to the semiconductor laser 4.

The input voltage generating section 1 provides an input voltage $V_i$ as shown in part (a) of FIG. 2, which is applied to the voltage converting section 2. As is apparent from part (a) of FIG. 2, when no pulse voltage $V_p$ is outputted, the input voltage $V_i$ is a DC voltage $V_f$. Because of the DC voltage $V_f$, the current I in the step recovery diode 8 in the voltage converting section 2 is as shown in part (b) of FIG. 2; that is, it is a constant forward current $I_f$. In this operation, the output voltage $V_j$ of the voltage converting section 2 is as shown in part (c) of FIG. 2; that is, it is a DC voltage $V_f$.

When, under this condition, a reverse pulse voltage $V_p$ is applied to the step recovery diode 8 at the time instant A, the current I flowing in the step recovery diode 8, after being delayed from the time instant A by a delay time to which is determined by the inductance L of the inductor 7, becomes a reverse current $I_r$ at the time instant B, so that, for a period of time $T_s$, the step recovery diode 8 is rendered conductive; that is, its resistance is made substantially zero. As a result, the output voltage $V_j$ of the voltage converting section 2 is decreased as much as a potential difference $V_r$ as shown in part (c) Of FIG. 2.

In general, the step recovery diode 8 is designed so that it is longer in reverse conduction period than an ordinary diode, and its carriers disappear in an extremely short transition time after the conduction time has passed. Therefore, after the lapse of the period $T_s$, the resistance increases substantially to infinity with an extremely short transition time at the time instant C as shown in part (b) of FIG. 2. That is, the step recovery diode 8 is rendered non-conductive. As a result, the flowing of the reverse current $I_r$ is abruptly suspended, and the following potential difference is provided across the inductor 7 because of the transition reaction:

$$\Delta V = -L\, (dI_r/dt) \tag{1}$$

Therefore, the output voltage $V_j$ of the voltage generating section 2 is further decreased by $\Delta V$.

The inductance L of the inductor 7 and the delay time $T_o$ are so selected that, as shown in part (a) of FIG. 2, the input voltage $V_i$ becomes forward with respect to the step recovery diode 8 at the time instant C. Therefore, after the potential difference $\Delta V$ is provided across the inductor 7, as shown in part (b), a forward current If flows in the step recovery diode 8 immediately in response to the forward input voltage $V_i$, and as shown in part (c) of FIG. 2, the output voltage $V_j$ quickly becomes equal lo the voltage $V_f$, and the potential difference $\Delta V$ disappears immediately. Thus, the output voltage $V_j$ of the voltage converting section can be converted into a very short pulse voltage reflecting the change of the potential difference $\Delta V$. Immediately after the very short pulse voltage is outputted, the DC voltage $V_f$ is applied to the step recovery diode, as was described above. Therefore, even when the frequency of the input voltage, that is, the frequency of the pulse voltage $V_p$, is changed in a wide range (for instance from a single pulse voltage to a pulse voltage having a repetitive frequency up to several tens of mega-Hertz (MHz)), the waveform of very short voltage pulses is maintained unchanged. The switching speed of the step recovery diode 87 is considerably high, several hundreds of pico-seconds (in equation (1), dt is very small). Therefore, the amplitude of the very short pulse voltage or the output voltage $V_j$ can be made larger than that of the input voltage $V_i$ (or that of the pulse voltage $V_p$) according to equation (1).

When the voltage converting section 2 applies the above-described output voltage $V_j$ to the driving section 3, a DC component is removed from the output voltage $V_j$ with the aid of the variable capacitor 13, and the resultant voltage is applied to the light source, namely, the semiconductor laser 4 and to the delay line 12.

Figure 3A:
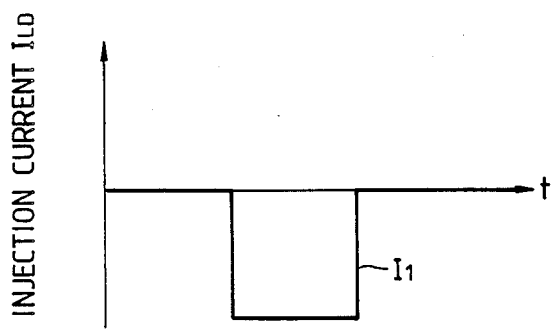
FIGS. 3(a) through 3(c) are diagrams for a description of the relaxation oscillation of a semiconductor laser.
Figure 3B:
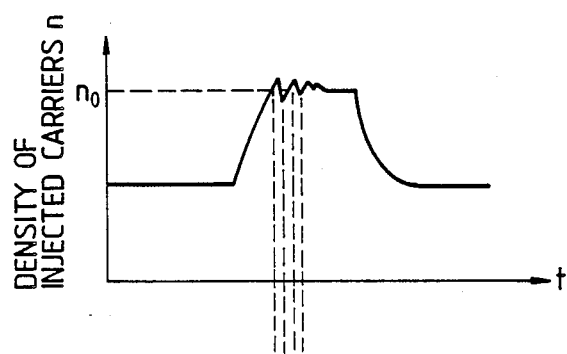
Figure 3C:
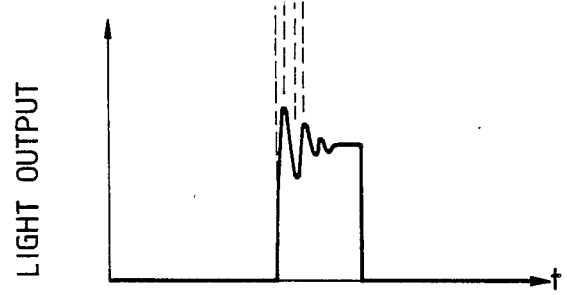

Upon application of the output voltage $V_j$ to the semiconductor 4, a current $I_1$ as shown in part (d) of FIG. 2 flows, as an injection current $I_{LD}$, in the semiconductor laser 4. This will be described with reference to parts (a) through (c) of FIG. 3 in more detail. When the current $I_1$ flows as shown in part (a) of FIG. 3, then the density n of carriers injected into the semiconductor laser 4 increases to a steady value $n_o$ while repeating relaxation oscillation as shown in part (b) of FIG. 3. As a result, the output beam of the semiconductor laser 4 reflects the transition oscillation as shown in part (c) of FIG. 3. The relaxation oscillation is attributed to the excessive injection of carriers to the semiconductor laser 4.

In order to overcome this difficulty, in the embodiment the output voltage $V_j$ is delayed with the delay line 12, and is inverted in polarity and applied, as an inverted very short pulse voltage, to the semiconductor laser 4. As a result, slightly later than the current $i_1$, a current $I_2$ opposite in polarity to the current $I_1$ is applied, as the injection current $I_{LD}$, to the semiconductor laser 4 as shown in part (d) of FIG. 2, to remove the carriers excessively injected into the semiconductor laser 4. As a result, relaxation oscillation due to the density n of carriers injected into the semiconductor laser 4 decrease so that for instance the oscillation after the second peak $P_2$ is eliminated, and the output beam of the semiconductor laser is reduced in relaxation oscillation.

Figure 4:
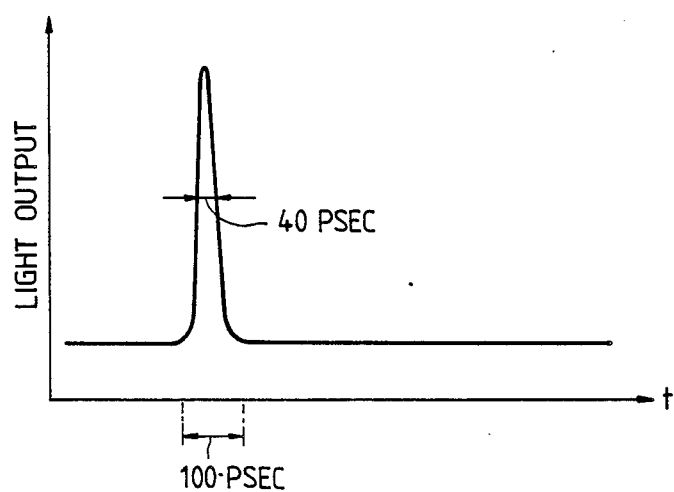
FIG. 4 is a graphical representation indicating the result of measurement of a light pulse outputted by the semiconductor laser which is driven by the light source driving unit according to the present invention.
Figure 2A:
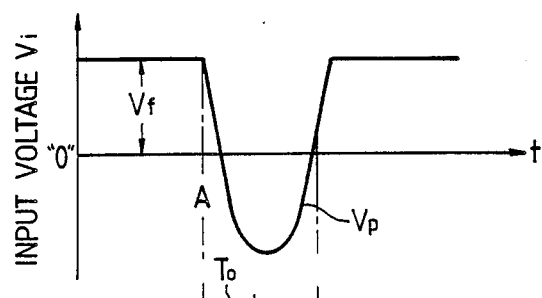
FIGS. 2(a) through 2(d) are timing charts indicating an input voltage, a current in a step recovery diode, an output voltage, and an injection current, respectively.
Figure 2B:
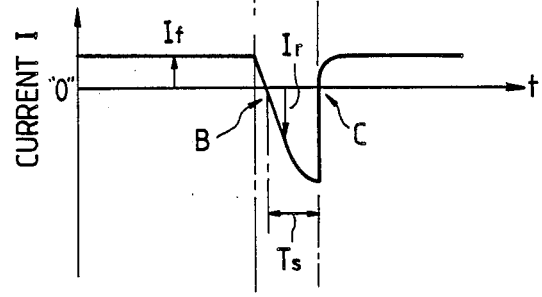
Figure 2C:
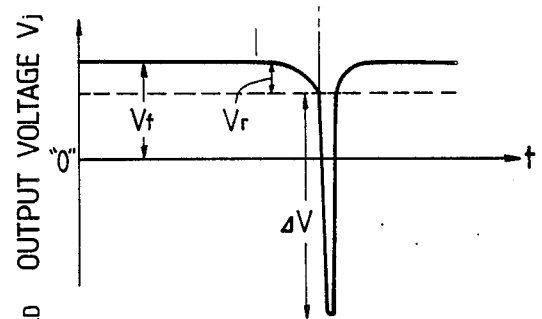
Figure 2D:
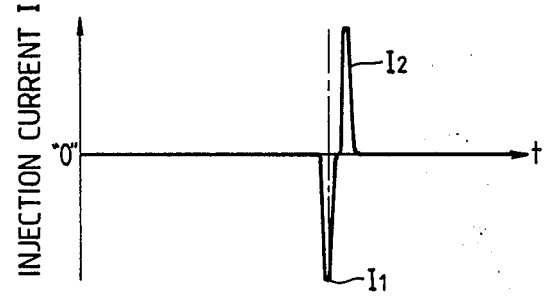

The Semiconductor laser 4 was driven in the above-described manner, and the output beam of the semiconductor laser 4 was measured. In this measurement, a very short light pulse about 40 psec (pico seconds) or less in full width at half maximum was measured as shown in FIG. 4. In the case where the semiconductor laser 4 is driven with the very short pulse voltage $V_j$ having a repetitive frequency from a single-shot to several tens of mega Hertz (MHz) changed in a wide range, the present invention ensures that the waveform of the very short pulse voltage is not affected even if the frequency of the input voltage $V_i$ is changed. Therefore, according to the present invention, it is possible to produce a very short, stable light pulse having a given frequency in a wide range of frequencies with its waveform unaffected by the change in frequency.

Figure 8:
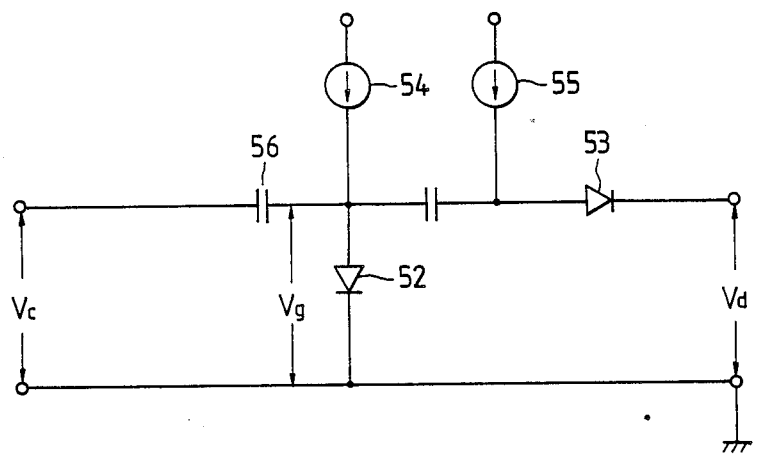
FIG. 8 is a circuit diagram showing a light source driving device with two step recovery diodes.
Figure 8:
Figure 8:
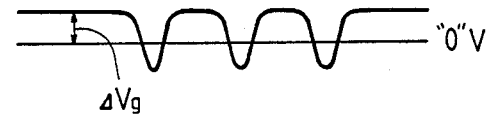

The light source driving device of the present invention requires a smaller number of circuit elements, and can be made smaller in size than that shown in FIG. 8.

Figure 5:
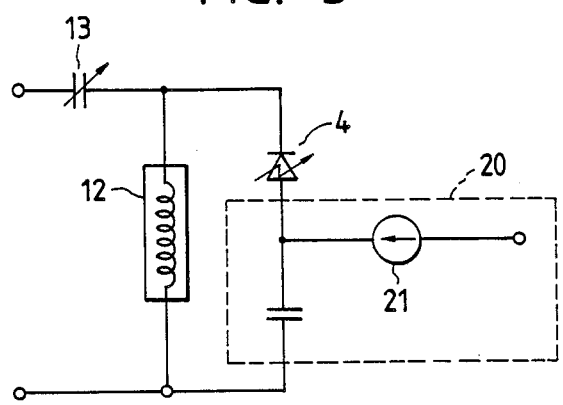
FIG. 5 is a circuit diagram showing a bias circuit provided for a driving section in the light source driving device shown in FIG. 1.
Figure 6:
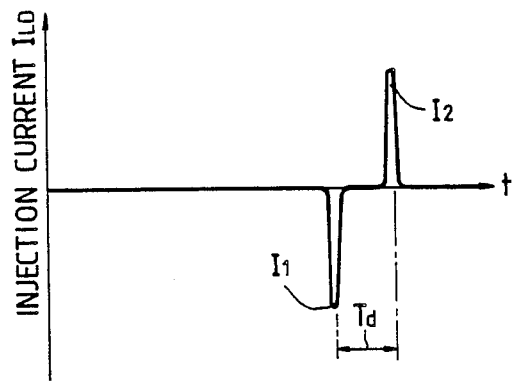
FIG. 6 is a graphical representation for a description of the adjustment of a time interval $T_d$ between injection currents $I_1$ and $I_2$.
Figure 7:
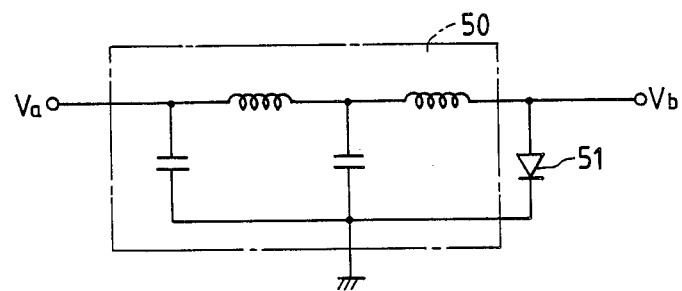
FIG. 7 is a current diagram showing a light source driving device with a comb generator.

The above-described light source driving device may be modified, as shown in FIG. 5, to include a bias circuit 20 for the driving section 2 so that a constant current source 21 applies a predetermined bias current to the semiconductor laser 4 to improve the operation of the semiconductor laser 4. In addition, instead of the delay line 12 in the driving section, a stab tuner capable of changing the length of a coaxial cable may be employed. In this case, the period of time that lapses from the time instant that the very short pulse voltage is applied to the semiconductor laser 4 until the very short pulse voltage opposite in polarity is applied to the semiconductor laser 4 can be changed and, as shown in FIG. 6, the time $T_d$ between the injection currents $I_1$ and $I_2$ can be adjusted. Furthermore in the above-described embodiment, the foward bias current $I_f$ or the injection currents $I_1$ and $I_2$ can be made adjustable.

As was described above, in the light source driving device according to the present invention, the input voltage formed by superposing a pulse voltage on a DC voltage is applied through the inductor means to the step recovery diode so that it is converted into a very short pulse voltage, and the very short pulse voltage is applied to the light source and is delayed by the delay means so that the very short pulse voltage inverted in polarity is applied to the light source. The device of the invention can cause the light source to stably produce a very short light pulse having a given frequency in a wide range of frequencies; that is, a single very short light pulse up to a very short light pulse having a repetitive frequency of several tens of mega-Hertz (MHz) with the waveform unaffected by the change in frequency.

What is claimed is:

1. A light source driving device, for driving a light source comprising:
   an input voltage generating section for superposing a pulse voltage on a predetermined DC voltage to provide an input voltage;
   a voltage converting section having inductor means and a step recovery diode; and
   a driving section having delay means,
   said voltage converting section applying said input voltage through said inductor means to said step recovery diode, to provide a very short pulse voltage,
   said driving section for applying said very short pulse voltage to the light source, and said delay means for delaying said very short pulse voltage, inverting the polarity thereof, and applying said inverted very short pulse voltage to the light source.

2. A light source driving device according to claim 1, wherein said input voltage generating section comprises a DC voltage source and a pulse voltage source.

3. A light source driving device according to claim 1, further including a parallel circuit including a variable resistor and a capacitor and wherein said step recovery diode is connected between said inductor means and said parallel circuit.

4. A light source driving device according to claim 1, wherein said driving section includes a variable capacitor.

5. A light source driving device according to claim 1, wherein said delay means comprises an inductor.

6. A light source driving device according to claim 1, wherein the light source comprises a semiconductor laser.

* * * * *